United States Patent
Montantes

(10) Patent No.: US 10,276,155 B2
(45) Date of Patent: Apr. 30, 2019

(54) MEDIA CAPTURE AND PROCESS SYSTEM

(71) Applicant: FUJITSU LIMITED, Kawasaki-shi, Kanagawa (JP)

(72) Inventor: James Montantes, San Jose, CA (US)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/388,683

(22) Filed: Dec. 22, 2016

(65) Prior Publication Data
US 2018/0182379 A1    Jun. 28, 2018

(51) Int. Cl.
*G10L 15/18* (2013.01)
*H04R 1/32* (2006.01)
(Continued)

(52) U.S. Cl.
CPC .... *G10L 15/1815* (2013.01); *G06F 17/30684* (2013.01); *G06F 17/30696* (2013.01); *G06F 17/30746* (2013.01); *G06K 9/00684* (2013.01); *G06K 9/00718* (2013.01); *G06N 5/04* (2013.01); *G06N 99/005* (2013.01); *G10L 15/22* (2013.01); *H03G 5/165* (2013.01); *H04R 1/326* (2013.01); *H04R 1/406* (2013.01); *H04R 3/04* (2013.01); *G06F 17/2785* (2013.01); *G06K 9/726* (2013.01); *G06N 5/022* (2013.01); *G10L 15/30* (2013.01); *H04R 3/005* (2013.01); *H04R 2499/11* (2013.01)

(58) Field of Classification Search
None
See application file for complete search history.

(56) References Cited

U.S. PATENT DOCUMENTS 5,058,171 A    10/1991  Wurzer et al.
5,764,778 A     6/1998  Zurek
(Continued)

FOREIGN PATENT DOCUMENTS

WO    2006/007441 A1    1/2006
WO    2007140403 A2    12/2007

OTHER PUBLICATIONS

"Data Sheet Fujitsu HS S2000NC Headset Accessories Multimedia" 2012.
(Continued)

*Primary Examiner* — Leonard Saint Cyr
(74) *Attorney, Agent, or Firm* — Maschoff Brennan

(57) ABSTRACT

A user media device may include a microphone array and a communication interface. The microphone array may include an omnidirectional microphone and a directional microphone. The microphone array may be selectively switchable. The communication interface may communicatively couple the user media device with a computer and may transmit audio captured by the microphone array to the computer for transfer to a remote service. The remote service may generate text of the processed audio via natural language processing. The remote service may further perform semantic reasoning of the processed audio via a semantic reasoning engine. The remote service may also generate content based at least in part on the semantic reasoning performed on the processed audio. The curated content may include a report having results of the semantic reasoning organized to demonstrate the results in a meaningful way with respect to the processed audio.

16 Claims, 4 Drawing Sheets

(51) Int. Cl.
| | |
|---|---|
| *G06F 17/30* | (2006.01) |
| *G06K 9/00* | (2006.01) |
| *G06N 5/04* | (2006.01) |
| *G06N 99/00* | (2019.01) |
| *H03G 5/16* | (2006.01) |
| *H04R 1/40* | (2006.01) |
| *H04R 3/04* | (2006.01) |
| *G10L 15/22* | (2006.01) |
| *G06F 17/27* | (2006.01) |
| *G06N 5/02* | (2006.01) |
| *G06K 9/72* | (2006.01) |
| *H04R 3/00* | (2006.01) |
| *G10L 15/30* | (2013.01) |

(56) References Cited

U.S. PATENT DOCUMENTS

| | | | |
|---|---|---|---|
| 6,694,143 | B1 | 2/2004 | Beamish et al. |
| 8,195,468 | B2 * | 6/2012 | Weider .............. G06F 17/30864 704/233 |
| 9,484,030 | B1 | 11/2016 | Meaney et al. |
| 9,575,960 | B1 * | 2/2017 | Lerner ................ G06F 17/2785 |
| 9,620,113 | B2 * | 4/2017 | Kennewick ............ G10L 15/22 |
| 2002/0057815 | A1 | 5/2002 | Killion |
| 2006/0222194 | A1 | 10/2006 | Bramslow |
| 2007/0223720 | A1 | 9/2007 | Goldberg |
| 2009/0150156 | A1 * | 6/2009 | Kennewick ........ G06Q 30/0261 704/257 |
| 2011/0231182 | A1 * | 9/2011 | Weider .............. G06F 17/30864 704/9 |
| 2014/0074843 | A1 * | 3/2014 | White .................. G06Q 10/107 707/737 |
| 2014/0188478 | A1 | 7/2014 | Zhang |
| 2015/0066917 | A1 | 3/2015 | Wang et al. |
| 2015/0066918 | A1 | 3/2015 | Wang et al. |
| 2015/0181357 | A1 | 6/2015 | Krystek |
| 2015/0254555 | A1 | 9/2015 | Williams, Jr. et al. |
| 2015/0286718 | A1 | 10/2015 | Wang et al. |

OTHER PUBLICATIONS

Fujitsu Takes Systematic Approach to Artificial Intelligence with "Human Centric AI Zinrai" (http://www.fujitsu.com/global/about/resources/news/press-releases/2015/1102-01.html) retrieved on Jan. 9, 2017.

Here One (https://hereplus.me/), retrieved Jan. 9, 2017.

Fujitsu Accessories (http://www.fujitsu.com/sg/products/computing/pc/ap/accessories/), retrieved Jan. 9, 2017.

European Search Report dated Nov. 8, 2017 in application No. EP 17 17 4851.

EP Office Action in application No. 17 174 851.0 dated Mar. 7, 2019.

* cited by examiner

MEDIA CAPTURE AND PROCESS SYSTEM

FIELD

The embodiments discussed herein are related to media capture and process systems.

BACKGROUND

Hearing aids are typically employed by users having some degree of hearing loss and attempt to amplify and modify detected audio in a manner that compensates for the users' hearing loss. Headphones, earphones, and headsets are typically employed to deliver audio from a device, such as a mobile phone, directly to a user. In some cases, such as with Bluetooth headsets, the headsets may be configured for two-way audio exchanges with the device so that a user may participate in a telephone conversation.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a media device may include a microphone array and a communication interface. The microphone array may include an omnidirectional microphone and a directional microphone. The microphone array may be selectively switchable. The communication interface may communicatively couple the user media device with a computer and may transmit audio captured by the microphone array to the computer for transfer to a remote service. The remote service may generate text of the processed audio via natural language processing. The remote service may further perform semantic reasoning of the processed audio via a semantic reasoning engine. The remote service may also generate content based at least in part on the semantic reasoning performed on the processed audio. The curated content may include a report having results of the semantic reasoning organized to demonstrate the results in a meaningful way with respect to the processed audio.

The object and advantages of the embodiments will be realized and achieved at least by the elements, features, and combinations particularly pointed out in the claims.

It is to be understood that both the foregoing general description and the following detailed description are exemplary and explanatory and are not restrictive of the claims.

BRIEF DESCRIPTION OF THE DRAWINGS

Example embodiments will be described and explained with additional specificity and detail through the use of the accompanying drawings.

DESCRIPTION OF EMBODIMENTS

Some conventional personal listening devices may work to enhance users' hearing, to encourage safe consumption of audio entertainment from a media player, or the like. However, these conventional devices may typically perform audio processing, if any, at the device, limiting the audio processing to processing resources available at the devices. Alternately or additionally, these conventional devices may generally not include a microphone array that may be selectively adjustable to adapt to particular listening situations. Furthermore, conventional listening devices may not store, process, analyze, curate, and/or report on detected audio and/or the substance of the detected audio.

Some embodiments may include a media capture and process system including a user media device. The user media device may include a personal user media device configured to be worn by a user. The user media device may include sensors for capturing audio media and/or visual media. For example, the user media device of the media capture and process system may include a microphone array that may be selectively adjustable to adapt the process of audio detection for particular situations. Alternately or additionally, the media capture and process system may process media captured by the user media device in real time at a computer separate from the user media device and/or at a remote service separate from the computer and the user media device. In some configurations, the media capture and process system may store and process the media captured by the user media device for analysis of the substance of the media. Alternately or additionally, the media capture and process system may curate and/or report on the substance of the media.

Embodiments will be explained with reference to the accompanying drawings.

Figure 1:
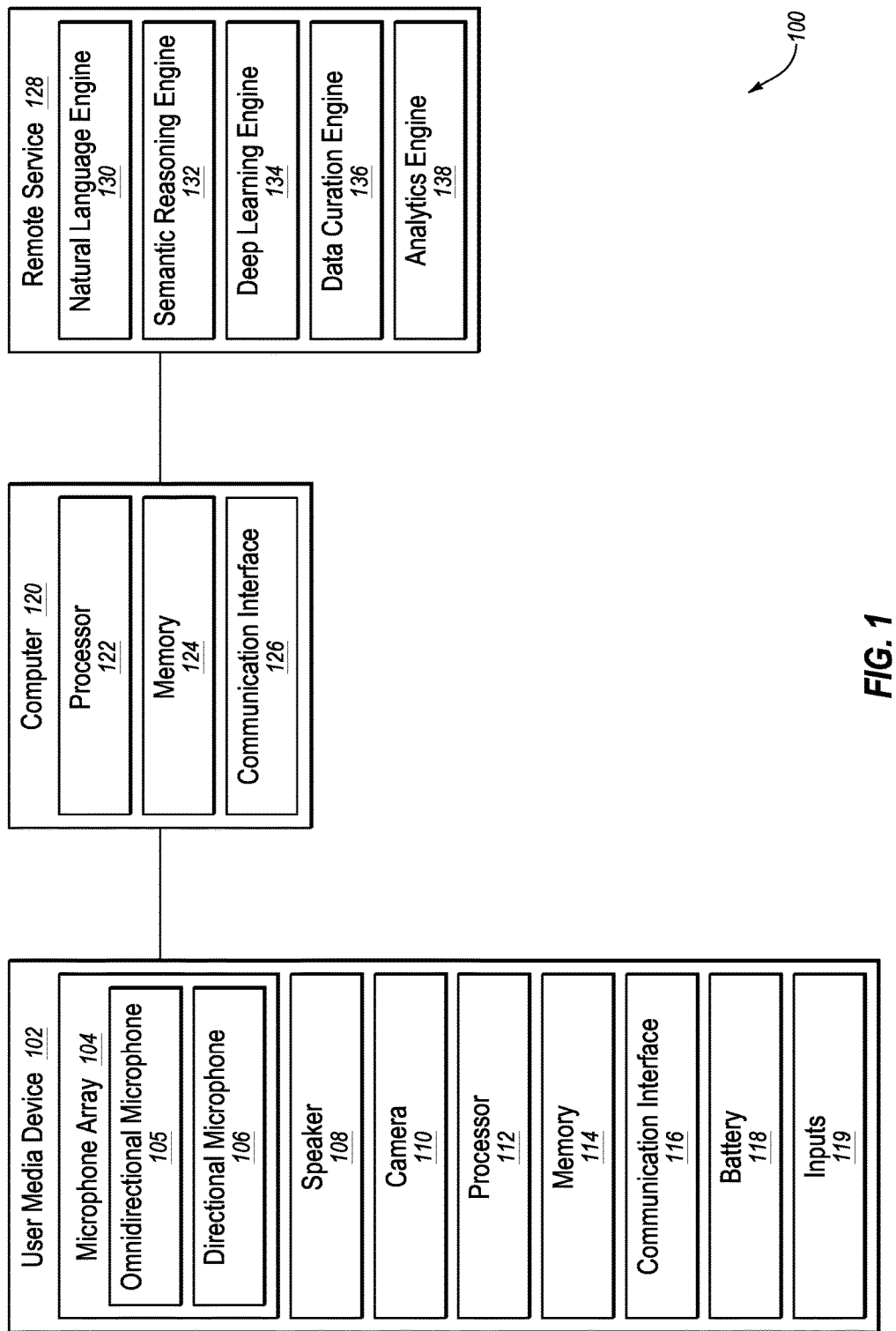
FIG. 1 is a diagram of a media capture and process system.

FIG. 1 is a diagram of a media capture and process system 100. The media capture and process system 100 may include a user media device 102. The user media device 102 may include a personal user media device configured to be worn by a user. The user media device 102 may capture media, such as audio media, visual media, or the like. The user media device 102 may include one or more speakers 108 for generating audio output for the user. For example, the user media device 102 may include speaker 108 positioned to be located near or partially within one or both ears of the user. By way of example, the user media device 102 may be configured to be worn in a manner similar to a single headphone or a pair of headphones, such as in-ear or earbud headphones, on-ear or clip-on headphones, over-ear or around-ear headphones, or the like. Alternately or additionally, the user media device 102 may be configured to worn in a manner similar to a hearing aid or a pair of hearing aids, a cochlear implant or a pair of cochlear implants, a helmet, a hat, so-called smart glasses, or the like.

The user media device 102 may include a microphone array 104 having an omnidirectional microphone 105 and a directional microphone 106. In some embodiments, the omnidirectional microphone 105 may include an omnidirectional digital microphone. Alternately or additionally, the directional microphone 106 may include a directional cardioid digital microphone or a hyper cardioid digital microphone.

In some embodiments, the user media device 102 may include a pair of omnidirectional microphones and a pair of directional microphones. In some configurations, each omnidirectional microphone 105 of the pair of omnidirectional microphones and each directional microphone 106 of the pair of directional microphones may be associated with a separate ear of the user. For example, an omnidirectional microphone 105 and a directional microphone 106 may be located near an ear of a user. In some embodiments, the directional microphone 106 or directional microphones may be positioned and located on the user media device 102 to detect audio originating from a direction the user is facing. For example, the directional microphone 106 or directional microphones may be configured to receive audio from a source being observed by the user.

In some embodiments, the microphones of the microphone array 104 may be selectively switchable. For example, the directional microphone 106 or directional microphones may be active and the omnidirectional microphone 105 or omnidirectional microphones may be inactive when the user is facing a particular audio source of interest. Alternately or additionally, both the directional microphone 106 or directional microphones may be active and the omnidirectional microphone 105 or omnidirectional microphones may be active and the input from the omnidirectional microphone 105 or omnidirectional microphones may be employed to perform noise cancelling relative to the input from the directional microphone 106 or directional microphones. Thus, for example, the microphone array 104 may be configured to enhance the clarity of the audio received by the microphone array 104 from a particular source, which may be beneficial in situations with significant background noise, such as lecture halls, conventions, or the like. Alternately or additionally, the omnidirectional microphone 105 or omnidirectional microphones may be active and the directional microphone 106 or directional microphones may be inactive. For example, when the user may not be focused on a particular audio source.

In some embodiments, the user media device may include an image capture device, such as a camera 110 or the like. The camera 110 may capture image media, such as picture media and/or video media.

The user media device 102 may include inputs 119 for controlling at least some operations of the user media device 102. For example, the inputs 119 may include an on-off switch, volume controls for controlling the volume of the speaker 108, a pairing switch for initiating a communicative coupling of the user media device 102 with another device, such as a computer 120, or the like or any combination thereof.

The media capture and process system 100 may also include the computer 120 communicatively coupled to the user media device 102. By way of example, the computer 120 may include a mobile phone, tablet computer, desktop computer, laptop computer, or the like coupled to the user media device 102. The computer 120 may include a communication interface 126. The computer 120 may transmit and/or receive media, including audio media and/or visual media, control commands, and/or other data or commands via the communication interface 126. For example, the computer 120 may receive audio and/or image media captured by the user media device 102. The communication interface 126 may include a Bluetooth interface, such as a Bluetooth low energy (LE) interface, and/or other personal area network (PAN) interfaces, a Wi-Fi interface and/or other local area network (LAN) interfaces, a Universal Serial Bus (USB) interface and/or other wired interfaces, or the like or any combination thereof.

The user media device 102 may include a communication interface 116 for communicatively coupling to the computer 120. In some embodiments, the communication interface 116 may generally correspond to the communication interface 126 of the computer 120. The user media device 102 may transmit and/or receive media, including audio media and/or visual media, control commands, and/or other data or commands via the communication interface 116. The communication interface 116 may include a Bluetooth interface, such as a Bluetooth LE interface, and/or other PAN interfaces, a Wi-Fi interface and/or other LAN interfaces, a USB interface and/or other wired interfaces, or the like or any combination thereof.

The user media device may be battery-powered to encourage portability, wearability, and the like. In some embodiments, the user media device 102 may include a battery 118. The battery 118 may include a lithium ion rechargeable battery, or the like. Alternately or additionally, the user media device 102 may be powered via a wired connection, such as a micro USB connection that may be employed to charge the battery 118 of the user media device 102 and/or as the communication interface 116 to transfer data to and from the user media device 102.

The user media device 102 may include a processor 112 and/or memory 114. The processor 112 may control operation of the user media device 102, including the microphone array 104, the speaker 108, the camera 110, the communication interface 116, or the battery 118. In some embodiments, the processor 112 may perform on-device audio processing, such as noise cancelation or the like.

In some embodiments, the computer 120 may control the operation of the user media device 102. For example, the user may use the computer 120 to transmit control commands to the user media device 102 for controlling the microphone array 104 or playback settings, such as controlling speaker 108 volume, microphone array 104 sensitivity, the activation and/or deactivation of the omnidirectional microphone 105 and the directional microphone 106, noise cancelation settings, multiband equalization, frequency filtering, high pass and/or low pass filtering, pitch modulation, or the like and any combination thereof. In some configurations, an application associated with the user media device 102 may be located in memory 124 of the computer 120 and, when executed by a processor 122 of the computer 120, may allow the user to control the user media device 102.

In some embodiments, the computer 120 may be configured to process the audio captured by the microphone array 104 of the user media device 102. By way of example, the audio processing of the audio from the user media device 102 may include performing parametric equalization, frequency filtering, noise reduction, or the like or any combination thereof on the audio from the user media device 102. The audio processing may be performed in real-time. Audio processing at the computer 120 may be relatively more robust than audio processing at the user media device 102. For example, design considerations for the user media device 102, such as device size, power, cost, weight, and the like, may encourage relatively In some embodiments, the processed audio may be communicated back to the user media device 102 and generated by the speaker 108 of the user media device. Thus, for example, the processed audio may be delivered to the user of the user media device 102. Alternately or additionally, the audio from the user media device 102 may be recorded for future use.

Alternately or additionally, the computer 120 may be configured to process image media captured by the camera 110 of the user media device 102. By way of example, the image processing of the image media from the user media device may include performing image enhancements, image augmentations, video stabilization, panoramic image generation or the like or any combination thereof on the image media from the user media device 102. The video processing may be performed in real-time. The processed video may be communicated back to the user media device 102. Optionally, the processed video may be displayed at a display of the user media device. For example, the processed video may be displayed at an optical head-mounted display (OHMD) of the user media device 102. Alternately or additionally, the image media from the user media device may be recorded for future use.

In some embodiments, the media capture and process system 100 may include a remote service 128. By way of example, the remote service 128 may include an internet-based or internet-accessed service, such as a so-called cloud service or cloud-based service. In some embodiments, the media captured by the user media device 102 may be provided to the remote service 128 for processing. Alternately or additionally, the media captured by the user media device 102 may be provided to the remote service 128 with additional information, such as user tags, subject tags, timestamps, geographic data, or the like or any combination thereof. In some configurations the additional information may be predefined by the user, set automatically by the user media device 102 or the computer 120, created by the user, modified by the user, or the like.

The remote service 128 may include a natural language engine 130, a semantic reasoning engine 132, a deep learning engine 134, a data curation engine 136, and/or an analytics engine 138. Processing the audio from the user media device 102 may include performing natural language processing via the natural language engine 130, performing semantic reasoning via the semantic reasoning engine 132, and/or performing deep learning via the deep learning engine 134.

For example, the natural language engine 130 may generate a text transcript of the audio via natural language processing. Alternately or additionally, the semantic reasoning engine 132 may assign relevancy scores to words included in the audio via semantic reasoning. For example, relevancy scores may be assigned to each word based on a frequency of use, a context, the subject tags, or the like or any combination thereof. In some embodiments, the semantic reasoning engine 132 may perform semantic reasoning on the text transcript of the audio generated by the natural language engine 130.

In some embodiments, the deep learning engine 134 may perform object detection, context analysis, image processing, or the like on the image media from the user media device 102 via deep learning. Information regarding the detected objects, context, or meaning of the image media may be added to the image media. For example, tags identifying objects, people, places, or the like may be added to the image media. In the case of picture media, the information may be added to the picture. In the case of video media, a subset of frames, e.g., every nth frame, may be analyzed and the information may be added to the frames, to the video, and/or to lengths of the video.

In some embodiments, the results of the natural language processing, semantic reasoning, and/or deep learning may be saved, displayed, and/or analyzed. The results of and/or information related to the natural language processing, semantic reasoning, and/or the deep learning may be curated and provided for inspection via a webpage or the like. For example, context, text, relevant related images, external links, analytical data, statistical data, or the like, based on the data may be provided. Customized reports and/or curated websites may be created based on users' predefined keywords, history, preferences, or the like.

In some embodiments, a data curation engine 136 may curate the results of the natural language processing, semantic reasoning, and/or deep learning. Curating the results may include organizing or grouping the results to demonstrate the results in a meaningful way, to provide some insights into the results, or the like.

Alternately or additionally, an analytics engine 138 may analyze the results of the natural language processing, semantic reasoning, and/or deep learning via statistical analysis or the like. The analytics engine 138 and/or the data curation engine 136 may identify insights based on the results. Alternately or additionally, the analytics engine 138 and/or the data curation engine 136 may create reports based on the identified insights, the results, or the like. In some embodiments, the curated results, the analysis of the results, the identified insights, the reports, or the like may be accessible via an application programming interface (API), shared to an internal or external social network, or the like or any combination thereof.

Figure 2:
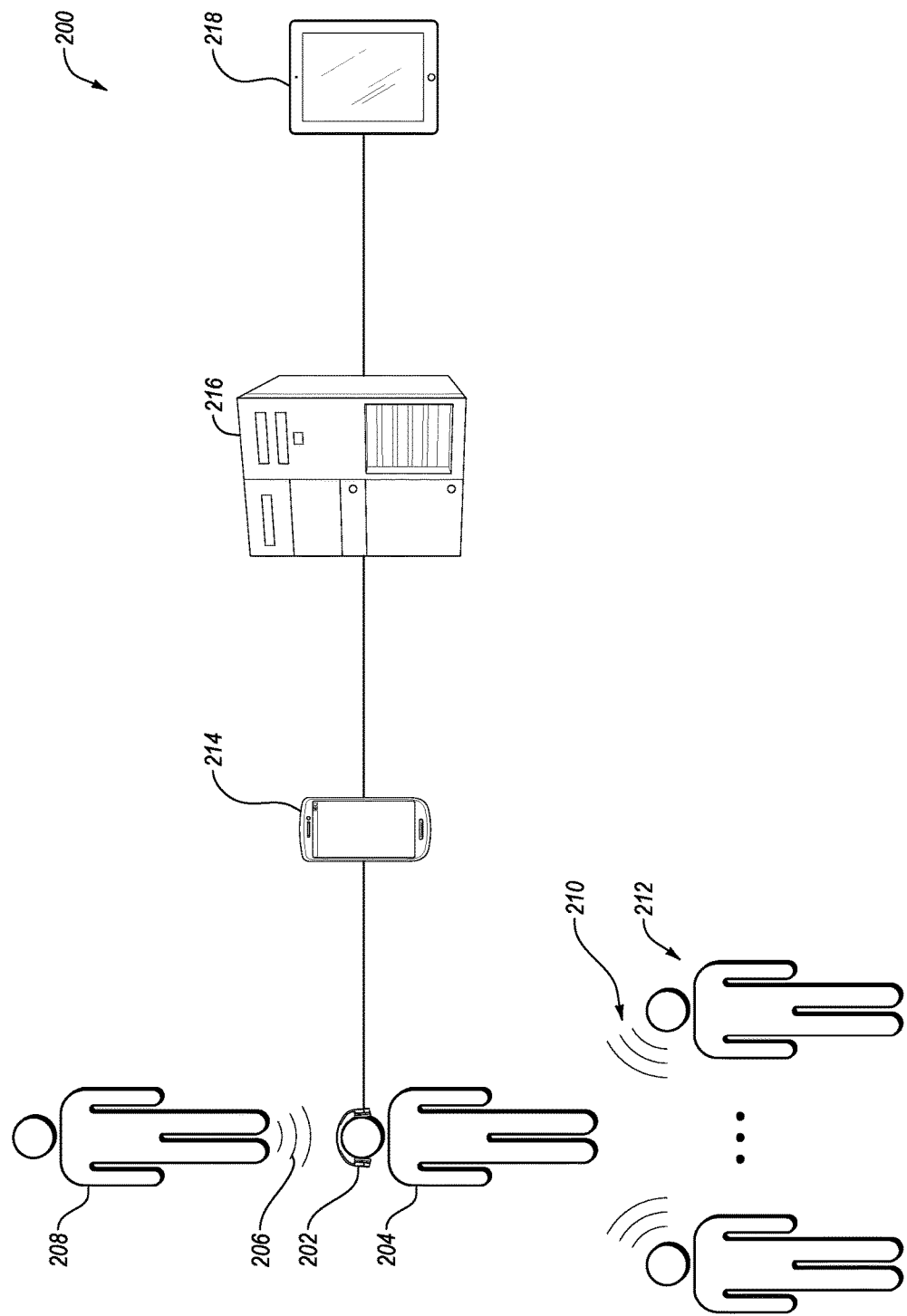
FIG. 2 is a diagram of another example media capture and process system in an example environment.

FIG. 2 is a diagram of another example media capture and process system 200 in an example environment. The media capture and process system 200 may include a user media device 202 generally corresponding to the user media device 102 of FIG. 1. The user media device 202 may be worn by a user 204. By way of example, the user media device 202 may be used to capture audio 206 from a speaker 208. Alternately or additionally, the user media device 202 may be used to capture video and/or pictures of the speaker 208, presentation material, or the like. The speaker 208 may be addressing a group of people, such as a professor lecturing a classroom of students, a lecturer speaking to a room of attendees, an actor performing for a theatre of patrons, or the like.

In some embodiments, the user media device 202 may perform noise canceling to reduce or eliminate background noise 210, potentially generated by other people 212 in the group of people, in the audio captured by the user media device 202. For example, the user media device 202 may perform noise cancelling as described with reference to the microphone array 104 of FIG. 1.

The user media device 202 may be communicatively coupled to a computer 214 generally corresponding to the computer 120 of FIG. 1. For example, the user media device 202 may be communicatively coupled to a mobile phone associated with the user 204. In some embodiments, the user 204 may control the operation of the user media device 202 via the computer 214. Alternately or additionally, the user media device 202 may transmit captured media to the computer 214.

For example, the audio 206 and/or the background noise 210 captured by the user media device 202 may be sent to and processed by the computer 214. The processed audio may be sent back to the user media device 202 and played for the user. Thus, for example, the audio heard by the user 204 may be processed by the relatively powerful computer 214, which may encourage the user media device 202 to be relatively small, low-power, and/or inexpensive for the degree of audio processing made available to the user 204.

Alternately or additionally, the computer 214 may transmit the media received from the user media device 202 and/or the processed audio, or the like to a remote service 216 generally corresponding to the remote service 128 of FIG. 1. In some embodiments, the media may be sent to the remote service 216 via a network, such as the internet or the like. The remote service 216 may perform alternate or additional processing on the media received. For example, the remote service 216 may process the media in a manner similar to the remote service 128 of FIG. 1.

The remote service 216 may create reports, insights, or the like. For example, the remote service 216 may create content in a manner similar to the remote service 128 of FIG. 1. In some embodiments, the content created by the remote service 216 may be accessed by a computer 218 generally corresponding to the computer 120 of FIG. 1 and the computer 214. For example, the content may be accessible by the computer 214. In some embodiments, the content may be accessed via a network such as the internet, a website, an API, a social network, or the like or any combination thereof.

For this and other processes and methods disclosed herein, the functions performed in the processes and methods may be implemented in differing order. Furthermore, the outlined operations are provided only as examples, and some of the operations may be optional, combined into fewer operations, or expanded into additional operations without detracting from the essence of the embodiments.

Figure 3:
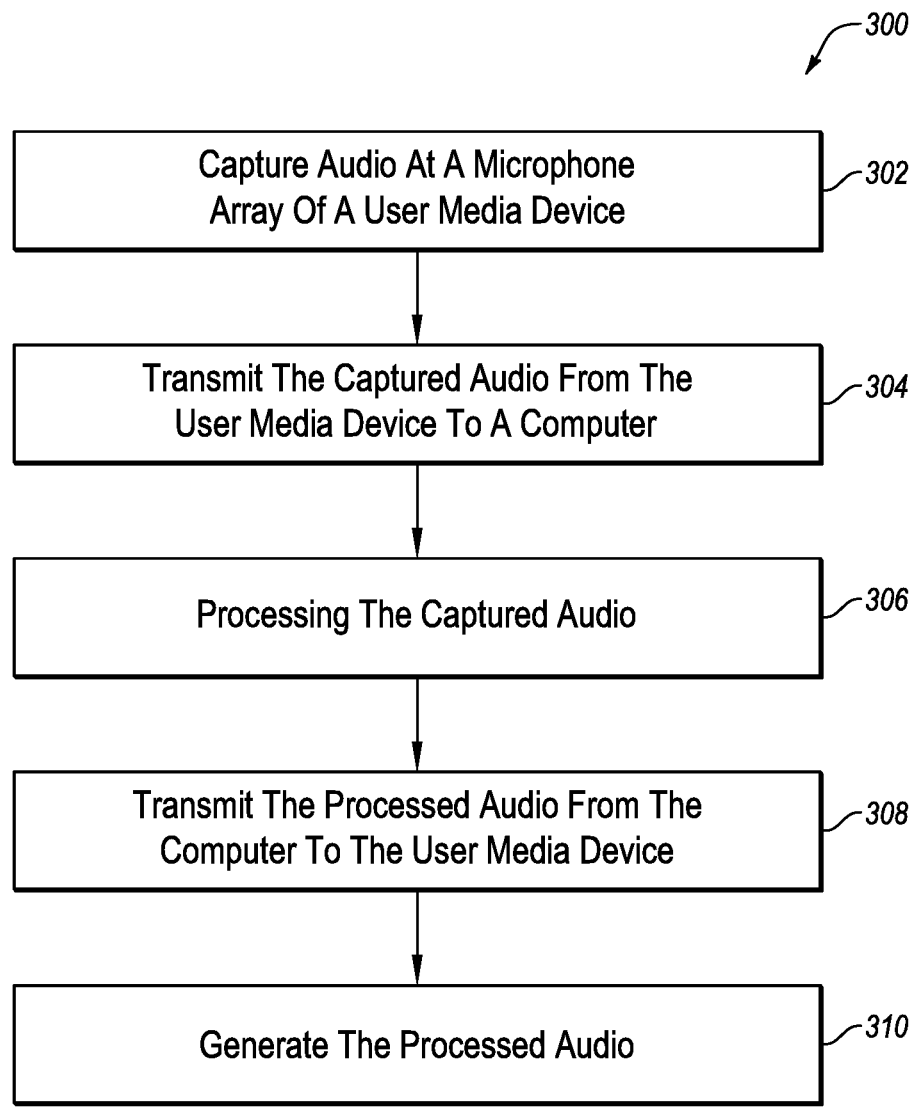
FIG. 3 is a flowchart of an example method.

FIG. 3 is a flowchart of an example method 300. The method 300 may be a method of processing audio captured by a user media device. The user media device may correspond generally to the user media device 102 of FIG. 1 and the user media device 202 of FIG. 2. The method 300 may begin at block 302 by capturing audio at a microphone array of the user media device. The microphone array may correspond generally to the microphone array 104 of FIG. 1.

The method 300 may continue to block 304 by transmitting the captured audio from the user media device to a computer. The computer may correspond generally to the computer 120 of FIG. 1 and the computer 214 of FIG. 2. The computer may be communicatively coupled to the user media device.

The method 300 may continue to block 306 by processing the captured audio at the computer. In some embodiments, processing the captured audio may include filtering the captured audio. Alternately or additionally, processing the captured audio may include equalizing the captured audio.

The method 300 may continue to block 308 by transmitting the processed audio from the computer to the user media device.

The method 300 may continue to block 310 by generating the processed audio at the user media device. For example, the processed audio may be generated by a speaker of the user media device. The speaker may correspond generally to the speaker 108 of FIG. 1.

For this and other processes and methods disclosed herein, the functions performed in the processes and methods may be implemented in differing order. Furthermore, the outlined operations are provided only as examples, and some of the operations may be optional, combined into fewer operations, or expanded into additional operations without detracting from the essence of the embodiments.

For example, in some embodiments, the method 300 may further include capturing visual media at a camera of the user media device. The camera may correspond generally to the camera 110 of FIG. 1. The method 300 may continue by transmitting the captured visual media from the user media device to the computer. Alternately or additionally, the captured visual media and one or more tags associated with the captured visual media may be transmitted from the computer to a remote service. The remote service may correspond generally to the remote service 128 of FIG. 1 or the remote service 216 of FIG. 2.

In some embodiments, the method 300 may further include transmitting the processed audio from the computer to the remote service. The remote service may generate text of the processed audio via natural language processing. In some embodiments, the natural language processing may be performed by a natural language engine corresponding to the natural language engine 130 of FIG. 1. Alternately or additionally, the remote service may perform semantic analysis or semantic reasoning of the processed audio via a semantic reasoning engine. The semantic reasoning engine may correspond generally to the semantic reasoning engine 132 of FIG. 1. In some embodiments, the remote service may generate curated content based at least in part on the semantic reasoning performed on the processed audio. The curated content may be generated by a data curation engine corresponding generally to the data curation engine 136 of FIG. 1.

Figure 4:
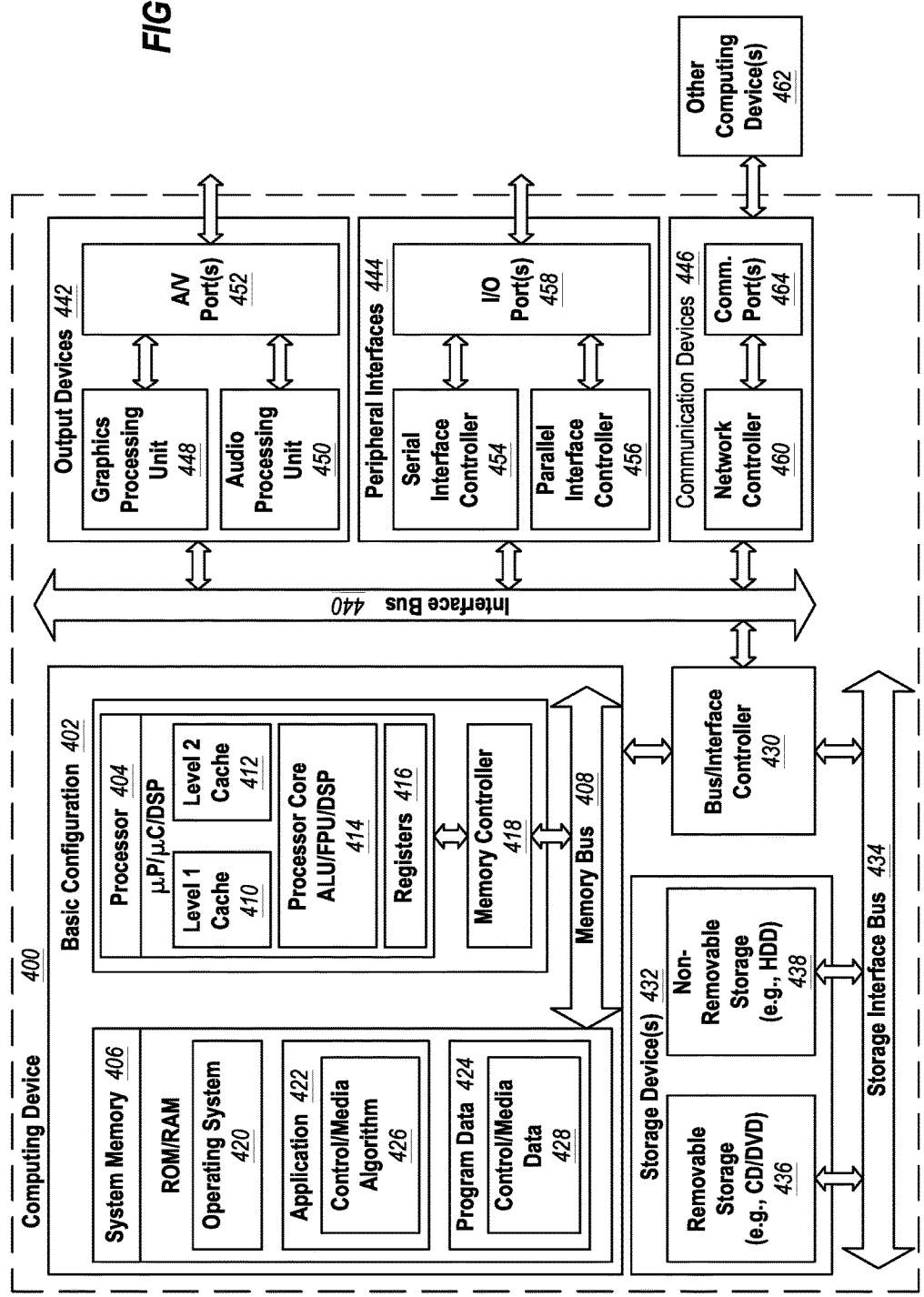
FIG. 4 is a block diagram illustrating an example computing device.

FIG. 4 is a block diagram illustrating an example computing device 400. The computing device may be arranged to predict behavior and/or encourage behavior modification in accordance with the present disclosure. The computing device 400 may be one example of an embodiment of the user media device 102 of FIG. 1, an embodiment of the computer 120 of FIG. 1, an embodiment of the remote service 128 of FIG. 1, an embodiment of the user media device 202 of FIG. 2, an embodiment of the computer 214, an embodiment of the computer 218 of FIG. 2, and/or an embodiment of the remote service 216 of FIG. 2. In a configuration 402, the computing device 400 includes one or more processors 404 and a system memory 406. The processor 404 and/or the memory 406 may generally correspond to the processor 112, the processor 122, the memory 114, and/or the memory 124 of FIG. 1. A memory bus 408 may be used for communicating between the processor 404 and the system memory 406.

Depending on the desired configuration, the processor 404 may be of any type including but not limited to a microprocessor (μP), a microcontroller (μC), a digital signal processor (DSP), or any combination thereof. The processor 404 may include one more levels of caching, such as a level one cache 410 and a level two cache 412, a processor core 414, and registers 416. An example processor core 414 may include an arithmetic logic unit (ALU), a floating point unit (FPU), a digital signal processing core (DSP Core), or any combination thereof. An example memory controller 418 may also be used with the processor 404, or in some implementations the memory controller 418 may be an internal part of the processor 404.

Depending on the desired configuration, the system memory 406 may be of any type including but not limited to volatile memory, such as Random Access Memory (RAM); non-volatile memory, such as Read Only Memory (ROM), flash memory, etc.; or any combination thereof. The system memory 406 may include an operating system 420, one or more applications 422, and program data 424. The application 422 may include a control algorithm and/or media processing algorithm 426 (also referenced as "control/media algorithm 426") may be arranged to perform the functions as described herein including those described with respect to the user media device 102 of FIG. 1, the computer 120 of FIG. 1, the remote service 128 of FIG. 1, the user media device 202 of FIG. 2, the powerful computer 214 of FIG. 2, the remote service 216 of FIG. 2, the computer 218 of FIG. 2, and/or the method 300 of FIG. 3. The program data 424 may include control data and/or media data 428 that may be useful for operation with the control algorithm and/or the media processing algorithm 426 as described herein. In some embodiments, the application 422 may be arranged to operate with the program data 424 on the operating system 420 such that the methods and processes may be provided as described herein.

The computing device 400 may have additional features or functionality, and additional interfaces to facilitate communications between the basic configuration 402 and other devices and interfaces. For example, a bus/interface controller 430 may be used to facilitate communications between the basic configuration 402 and one or more data storage devices 432 via a storage interface bus 434. The data storage devices 432 may be removable storage devices 436, non-removable storage devices 438, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

The system memory 406, the removable storage devices 436, and the non-removable storage devices 438 are examples of computer storage media. Computer storage media includes, but is not limited to, RAM, ROM, Electronically Erasable and Programmable Read Only Memory (EEPROM), flash memory or other memory technology, Compact Disc-Read Only Memory (CD-ROM), digital versatile disks (DVD) or other optical storage, magnetic cassettes, magnetic tape, magnetic disk storage or other magnetic storage devices, or any other medium which may be used to store the desired information and which may be accessed by computing device 400. Any such computer storage media may be part of computing device 400.

Computing device 400 may also include an interface bus 440 for facilitating communication from various interface devices (e.g., output devices 442, peripheral interfaces 444, and communication devices 446) to the basic configuration 402 via the bus/interface controller 430. Example output devices 442 include a graphics processing unit 448 and an audio processing unit 450, which may be configured to communicate to various external devices such as a display or speakers via one or more A/V ports 452. Example peripheral interfaces 444 include a serial interface controller 454 or a parallel interface controller 456, which may be configured to communicate with external devices such as input devices (e.g., keyboard, mouse, pen, voice input device, touch input device, etc.) or other peripheral devices (e.g., printer, scanner, etc.) via one or more input/output (I/O) ports 458. An example communication device 446 includes a network controller 460, which may be arranged to facilitate communications with one or more other computing devices 462 over a network communication link via one or more communication ports 464. The communication ports 464 may correspond generally to the communication interface 116 of FIG. 1 and/or the communication interface 126 of FIG. 1.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 400 may be implemented as a portion of a small-form factor portable (or mobile) electronic device such as a cell phone, a tablet computer, a smartphone, a smartwatch, smart glasses, a personal data assistant (PDA), a personal media player device, a wireless web-watch device, a personal headset device, an application specific device, or a hybrid device that include any of the above functions. The computing device 400 may also be implemented as a personal computer including both laptop computer and non-laptop computer configurations.

As used herein, the terms "engine" may refer to specific hardware implementations configured to perform the operations of the module and/or software objects or software routines that may be stored on and/or executed by the computing device 400. In some embodiments, the different components, engines, and services described herein may be implemented as a part of the application 422 and/or the control algorithm and/or the media processing algorithm 426. For example, the natural language engine 130, the semantic reasoning engine 132, the deep learning engine, the data curation engine, the analytics engine 138 of FIG. 1, and/or the method 300 of FIG. 3 may be implemented by computer-executable instructions stored in the system memory 406 and executed by the processor 404. While some of the system and methods described herein are generally described as being implemented in software, specific hardware implementations or a combination of software and specific hardware implementations are also possible and contemplated.

All examples and conditional language recited herein are intended for pedagogical objects to aid the reader in understanding the embodiments and the concepts contributed to furthering the art, and are to be construed as being without limitation to such specifically recited examples and conditions. Although embodiments have been described in detail, it should be understood that the various changes, substitutions, and alterations could be made hereto without departing from the scope of the embodiments.

What is claimed is:

1. A user media device comprising:
a microphone array configured to capture audio and including an omnidirectional microphone and a directional microphone, the microphone array being selectively switchable with respect to operation of the omnidirectional microphone and the directional microphone such that content of the captured audio is based on a selection setting of the microphone array; and
a communication interface to communicatively couple the user media device with a computer and to transmit audio captured by the microphone array to the computer to transfer to a remote service configured to perform operations comprising:
generating text of the captured audio via natural language processing;
performing semantic reasoning of the generated text via a semantic reasoning engine in which the semantic reasoning includes: identifying a frequency of use of words included in the text, identifying a context of use of the words in the text, and identifying a subject tag associated with the words;
determining a relevancy of the words based on the semantic reasoning;
accessing user information related to a user of the user media device in which the user information includes: predefined keywords, a history of the user, and preferences of the user;

generating curated content based on the relevancy of the words included in the text as determined from the semantic reasoning performed on the generated text and based on the user information, wherein the curated content is customized according to the predefined keywords, history of the user, and preferences of the user included in the user information and includes a report having images, external links, analytical data, and statistical data that provide insight about the captured audio; and]

causing presentation of the curated content on a user interface;

wherein the computer is configured to perform operations comprising:

performing audio processing operations with respect to the captured audio, the audio processing operations including one or more of: filtering the captured audio and equalizing the captured audio; and transmitting the processed audio to the user media device, wherein the communication interface of the user media device receives the processed audio and the user media device includes a speaker configured to present the received processed audio.

2. The user media device of claim 1, wherein the microphone array includes a second omnidirectional microphone and a second directional microphone.

3. The user media device of claim 1, wherein audio captured by the omnidirectional microphone is employed to perform noise cancelation relative to the audio captured by the directional microphone.

4. The user media device of claim 1, further comprising a camera.

5. The user media device of claim 1, wherein the user media device is configured to be worn on a head of a user.

6. The user media device of claim 1, wherein the microphone array is selectively switchable based at least in part on control commands received by the user media device from the computer.

7. A method of processing audio captured by a user media device, the method comprising:

capturing audio at a microphone array of the user media device;

transmitting the captured audio from the user media device to a computer communicatively coupled to the user media device;

processing the captured audio at the computer including performing one or more of: filtering the captured audio and equalizing the captured audio;

transmitting the processed audio from the computer to the user media device, wherein a communication interface of the user media device receives the processed audio and the user media device includes a speaker configured to present the received processed audio;

presenting the processed audio at a speaker of the user media device;

generating text of the captured audio via natural language processing;

performing semantic reasoning of the generated text via a semantic reasoning engine in which the semantic reasoning includes: identifying a frequency of use of words included in the text, identifying a context of use of the words in the text, and identifying a subject tag associated with the words;

determining a relevancy of the words based on the semantic reasoning;

accessing user information related to a user of the user media device in which the user information includes: predefined keywords, a history of the user, and preferences of the user;

generating curated content based on the relevancy of the words included in the text as determined from the semantic reasoning performed on the generated text and based on the user information, wherein the curated content is customized according to the predefined keywords, history of the user, and preferences of the user included in the user information and includes a report having images, external links, analytical data, and statistical data that provide insight about the captured audio; and causing presentation of the curated content on a user interface.

8. The method of claim 7, further comprising:

capturing visual media at a camera of the user media device; and transmitting the captured visual media from the user media device to the computer.

9. The method of claim 8, further comprising transmitting the captured visual media and one or more tags associated with the captured visual media from the computer to a remote service.

10. The method of claim 7, further comprising:

transmitting the processed audio from the computer to a remote service;

generating, at the remote service, text of the processed audio via natural language processing;

performing semantic reasoning of the generated text via a semantic reasoning engine in which the semantic reasoning includes: identifying a frequency of use of words included in the text, identifying a context of use of the words in the text, and identifying a subject tag associated with the words;

determining a relevancy of the words based on the semantic reasoning; and the generating of the curated content is based on the relevancy of the words included in the text as determined from the semantic reasoning performed on the processed audio.

11. A media capture and process system comprising:

a computer;

a user media device including:

a microphone array; and a communication interface for communicatively coupling the user media device with the computer and for transmitting audio captured by the microphone array to the computer, wherein the computer is configured to perform operations comprising:

performing audio processing operations with respect to the captured audio, the audio processing operations including one or more of: filtering the captured audio and equalizing the captured audio; and transmitting the processed audio to the user media device, wherein the communication interface of the user media device receives the processed audio and the user media device includes a speaker configured to present the received processed audio; and a remote service for receiving the captured audio from the computer and processing the captured audio, the remote service including:

a semantic reasoning engine for performing semantic analysis on the captured audio in which the semantic reasoning includes: identifying a frequency of use of words included in the captured audio, identifying a context of use of the words in the captured audio, and identifying a subject tag associated with the words and wherein the semantic reasoning engine further determines a relevancy of the words based on the semantic reasoning;

a data curation engine for curating data associated with the captured audio based on the relevancy of the words included in the captured audio as determined from the semantic reasoning to generate curated content that is customized according to predefined keywords, history of the user, and preferences of the user included in user information accessed by the data curation engine and includes analytical data and statistical data that provide insight about the captured audio;

an analytics engine for generating reports based on the captured audio, wherein the report includes images, external links, analytical data, and statistical data that provide insight about the captured audio; and a network controller that communicates the curated content to a user device such that the curated content is displayed on the user device.

12. The media capture and process system of claim 11, wherein the microphone array includes an omnidirectional microphone and a directional microphone, the microphone array being selectively switchable.

13. The media capture and process system of claim 11, wherein the remote service includes a natural language engine for converting the captured audio to text.

14. The media capture and process system of claim 11, wherein the reports are accessible via an application programming interface (API).

15. The media capture and process system of claim 11, wherein the analytics engine generates the reports based on the captured audio at least in part via statistical analysis of results of the semantic analysis.

16. The media capture and process system of claim 11, wherein the user media device further includes a camera for capturing visual media and the remote service includes a deep learning engine for performing, on the captured visual media, at least one of object detection, context analysis, and image processing.

* * * * *